United States Patent [19]
Groger et al.

[11] Patent Number: 5,177,805
[45] Date of Patent: Jan. 5, 1993

[54] OPTICAL SENSORS UTILIZING MULTIPLE REFLECTION

[75] Inventors: Howard P. Groger; Adel K. Sarrafzadeh, both of Blacksburg, Va.

[73] Assignee: American Research Corp. of Va., Radford, Va.

[21] Appl. No.: 678,083

[22] Filed: Apr. 1, 1991

[51] Int. Cl.⁵ .................... G02B 6/02; H01J 5/16
[52] U.S. Cl. .......................... 385/12; 385/13; 385/14; 385/33; 385/35; 385/131; 250/227.11; 250/227.14; 250/227.19; 250/231.19
[58] Field of Search ............ 385/12, 13, 14, 31, 385/33, 35, 37, 129, 130, 131; 250/227.11, 227.14, 227.18, 227.19, 227.20, 227.24, 231.19

[56] References Cited

U.S. PATENT DOCUMENTS

| | | | |
|---|---|---|---|
| 3,282,148 | 11/1966 | Yamada | 356/345 |
| 4,293,188 | 10/1981 | McMahon | 385/13 |
| 4,378,497 | 3/1983 | Giallorenzi | 250/227.19 |
| 4,477,723 | 10/1984 | Carome et al. | 250/227.19 |
| 4,581,530 | 4/1986 | Brogardh et al. | 250/227.21 |
| 4,627,728 | 12/1986 | Willson | 356/345 |
| 4,675,522 | 6/1987 | Arunkumar | 250/227.19 |
| 4,697,146 | 9/1987 | Extance et al. | 385/12 |
| 4,731,581 | 3/1988 | Doriath et al. | 359/281 |
| 4,746,179 | 5/1988 | Dahne et al. | 385/12 |
| 4,815,843 | 3/1989 | Tiefenthaler et al. | 385/36 |
| 4,850,098 | 7/1989 | Yurek | 385/1 |
| 5,082,629 | 1/1992 | Burgess, Jr. et al. | 385/12 |
| 5,095,514 | 3/1992 | Curtis | 385/12 |
| 5,101,449 | 3/1992 | Takeuchi et al. | 385/12 |
| 5,114,864 | 5/1992 | Walt | 385/13 |

FOREIGN PATENT DOCUMENTS

| | | | |
|---|---|---|---|
| 0316619A1 | 5/1989 | European Pat. Off. | 385/12 X |
| 2123546A | 2/1984 | United Kingdom | 385/12 X |
| 2161268A | 1/1986 | United Kingdom | 385/12 X |

Primary Examiner—Brian Healy
Attorney, Agent, or Firm—Dickstein, Shapiro & Morin

[57] ABSTRACT

An improved method and apparatus for optically sensing and measuring physical quantities such as magnetic fields, electrical fields, mechanical strain, temperature, sound and pressure. The apparatus aspects of the invention involve a sensor structure consisting of a sandwich of magnetostrictive, piezoelectric or other materials sensitive to the physical quantity measured which are spaced apart by two opposed parallel reflecting surfaces located on opposing sides of the sensitive material. The reflecting surfaces can include an array of plane mirrors, diffraction gratings, curved mirrors, or retroreflecting spheres. In its method aspects, multiple optical reflections between the two surfaces provide a magnified optical phase shift when the shape of the slab that is sensitive to changes in the applied field causes mechanical strains in the material. The changed optical signal can be measured by a suitable measurement device such as an interferometer for phase comparison with a diffraction reference pattern. Alternative embodiments include providing multiple sensors in a sandwich type structure in order to increase measurement sensitivity and accuracy.

29 Claims, 12 Drawing Sheets

OPTICAL SENSORS UTILIZING MULTIPLE REFLECTION

FIELD OF THE INVENTION

The present invention relates to an optical fiber sensor apparatus and method for sensing and measuring changes in a physical quantity and/or property such as magnetic field, electrical field, mechanical strain, sound, temperature, pressure or chemical quantities such as the concentration of biological species, by employing the apparatus for measuring the interference patterns generated by its sensor based on multiple reflections between its parallel reflective surfaces. The parallel surfaces are spaced-apart by a material that is sensitive to the physical quantity being measured causing the optical path between parallel surfaces to be modulated.

DESCRIPTION OF THE PRIOR ART

Optical fiber magnetometers typically measure magnetic field strength by means of an interferometer which incorporates optical fibers attached to a layer of magnetostrictive material. The fibers are subjected to magnetostrictive stress such that the optical length of the material changes the length of the fibre. This magnetic field produces a modulation of the optical path length of one arm of the interferometer to give rise to an interference fringe pattern which is compared to a reference pattern produced from a reference sensor.

The types of sensors used in these arrangements involve, for example, Mach-Zehnder or Fabry-Perot cavities.

The classic Fabry Perot cavity, for example, consists of two spaced-apart plane parallel reflectors. The space between the reflectors contains air or a vacuum. A recent development includes placing an optical fibre, coated with magnetostrictive material between the reflectors. The cavity works by sensing the change in the effective cavity length caused by a change in the length of the fiber imparted by the magnetic field.

Fiber-optics are also used for measuring electric fields. Typically, these arrangements involve winding an optical fiber back and forth across a piezoelectric plate or other electrically sensitive material or coating the fiber with piezoelectric material, such as polyvinylidene fluoride. The imposition of an electrical field causes mechanical strain on the piezoelectric that is usually parallel to the optical fiber's axis. As a result, the length of the fiber is modulated which in turn shifts the phase of the coherent light. The phase shift is then detected and processed to indicate the magnitude of the electric field.

Fiber-optics also are used to measure temperature/pressure, velocity and mechanical strain. For example, a recently developed sensor was shown consisting of an optical waveguide that includes a multiply reflective sensor arrangement for setting up an interference pattern. The arrangement is based upon sensing the interference pattern generated by multiple reflections between two parallel reflective surfaces. The resulting signal modulation is representative of changes in the optical length that exists between the parallel surfaces. The distance between the surfaces is modulated by the direct physical effect of pressure on a diaphragm connected to one of the two parallel planes and placed remotely from the optical fiber. Thus, if the physical quantity to be measured is pressure, the pressure differences applied to diaphragm causes it to flex. Because of its elasticity, a change occurs in the distance between the parallel surfaces, resulting in a deviation in the plane's reflective index.

The above-noted systems however suffer from several drawbacks.

For those reflective systems that rely on measuring the physical flexing between the parallel surfaces, their overall sensitivities are limited to only measuring those physical quantities that successfully produce flexing of the diaphragm. Such arrangements, however, are not readily adapted to measure physical quantities such as electrical fields, magnetic fields or temperatures.

An additional drawback of diaphragm-based arrangements is that the range of the physical quantity measured is limited by the physical properties of the diaphragm material and the construction of the sensor. The diaphragm's physical limitations may render it insensitive to minute variations in pressure while at extremely high ranges, the sensor may be too delicate to be used.

The drawback of the improved magnetometer field measuring system described above, is that it relies upon measuring a physical quantity by sensing the position change of an optical fiber in relation to a photoluminiscent body. However, since the position information that is measured is related to the dimensions of the optical fiber, such as change in length, the resolution of the device is limited.

A further drawback is that optical fibers incorporating a magnetostrictive are relatively delicate and often not suitable for testing in hostile environments or where the sensor is subject to movement.

A further disadvantage to the existing optical sensors such as the electric sensors that are coiled around a piezoelectric core they are relatively bulky, often requiring the fibers to be coiled up to one inch in diameter. An additional disadvantage of such arrangements is their inability to be sandwiched together in multiple layers in order to either provide a range of measurements across an entire field of the measured quantity or to provide enhanced sensitivity resulting from multiplying the optical readings from each respective sensor layer formed in the sandwich.

SUMMARY OF THE INVENTION

The foregoing shortcomings of prior known optical based sensor systems and methods are resolved by the present invention which provides for an optical system and an optical measuring method for measuring physical quantities and physical properties by means of a device having multiply reflective optical sensors having parallel reflective surfaces separated by spacer material and that is sensitive to the physical quantity being measured. In its method aspects, the present invention involves measuring the physical quantity by multiplying the sensed quantity based on the multiple-sampling passes in the sensor in order to increase its sensitivity.

The sensitive material consists of either a magnetostrictive film or layer, a piezoelectric thin film substrate, a thermally sensitive material, an electostrictive material, a strain sensitive material or films/fibers containing fluorescent dyes. The sensitive material is arranged to provide a space between parallel reflective surfaces such that the mechanical strains imparted to the material, when it is subject to the measured physical quantity, will alter its distance, or the parallelism of the reflective surfaces, or the relative position between the reflective surfaces. Such modulations cause phase shifting in the optical path and a change in the fringe interference patterns.

In addition, the invention provides for a sensor structure which is made of multiple sensor layers coupled together into a sandwich in order to provide increased sensitivity, increased accuracy and to potentially measure a larger amount of the physical quantity.

One principal object of the present invention, therefore, is to provide a multiply reflective optical measuring sensor which is capable of measuring physical quantities by means of a simple and durable structure.

An additional object of the invention is to provide an optical sensor which can be made into a sandwich structure comprising a plurality of individual sensors coupled together so as to produce a range of measured quantities.

Still another object of the invention is to provide an optical delay line with multiple pick-off points in order to sense changes across a given volume of the physical quantity measured.

A further object of this invention is to provide a signal processing element useful for performing optical correlation functions.

An added object of this invention is the provision of an optical processing device which utilizes an electromagnet and a magnetically sensitive material for processing the optical signal subject to the designated control of the electromagnet.

Yet an additional object of the present invention is to provide an optical sensor consisting of two parallel reflective planes spaced apart by a thin substrate that is sensitive to the physical quantity being measured causing collimated optical beams to be multiply reflected through an optical fiber array located between the parallel reflective planes.

A further object of the invention is to provide a method for measuring a physical quantity with increased sensitivity for a given volume by running multiple paths of an optical beam across a material that is sensitive to the measured quantity or property.

Another object of the invention is to provide a sensor that is capable of detecting weak magnetic fields in the human body or to evaluate material properties.

Still another object of this invention is for measuring the presence of chemical entities within a fluid confined between multiple reflecting sensor surfaces.

Still an additional object of the invention is to provide an optical sensor comprising an array of titanium diffused lithium niobate channels provided between reflective thin film surfaces and between films sensitive to the physical properties measured in order to provide an integrated optical circuit with increased sensitivity, durability and compactness.

Yet another object of the invention is to provide a sensor construction comprising a sandwich such that the output optical fiber from one sensor layer provides an input optical beam to an adjacent sensor layer. As a result, sensors can be sandwiched together in the same structure in order to produce an amplified optical phase change output for measurement, or multiple parallel outputs with varying levels of sensitivity.

These and other objects, advantages and features of the invention are obtained in an optical sensor which comprises a slab of magnetostrictive, piezoelectric or thermally sensitive material attached to two parallel reflecting surfaces disposed on opposite sides of the slab. The surfaces may be an array of plane mirrors, diffraction gratings or multiple retro-reflecting spheres.

The system, which relies multiple reflections between the two surfaces, produces a magnified phase shift when the shape of the slab of sensitive material changes due to an applied field. When retro-reflective spheres are used, they are arranged so that they are opposed at half wavelength distances along each array.

The sensor can be incorporated and used in conjunction with an interferometer for phase comparison with a reference. In addition, the sensor can be used as a stand-alone magnetometer, or an electric or a thermal field sensor, directly connected to suitable optical analysis equipment.

The invention will be better understood from the following detailed description which is provided in connection with the accompanying Figures.

DETAILED DESCRIPTION OF THE FIGURES

FIG. 3F is an exploded perspective view of an integrated optical sensor representing a fifth embodiment of the invention;

DETAILED DESCRIPTION OF THE PREFERRED EMBODIMENTS

Figure 1A:
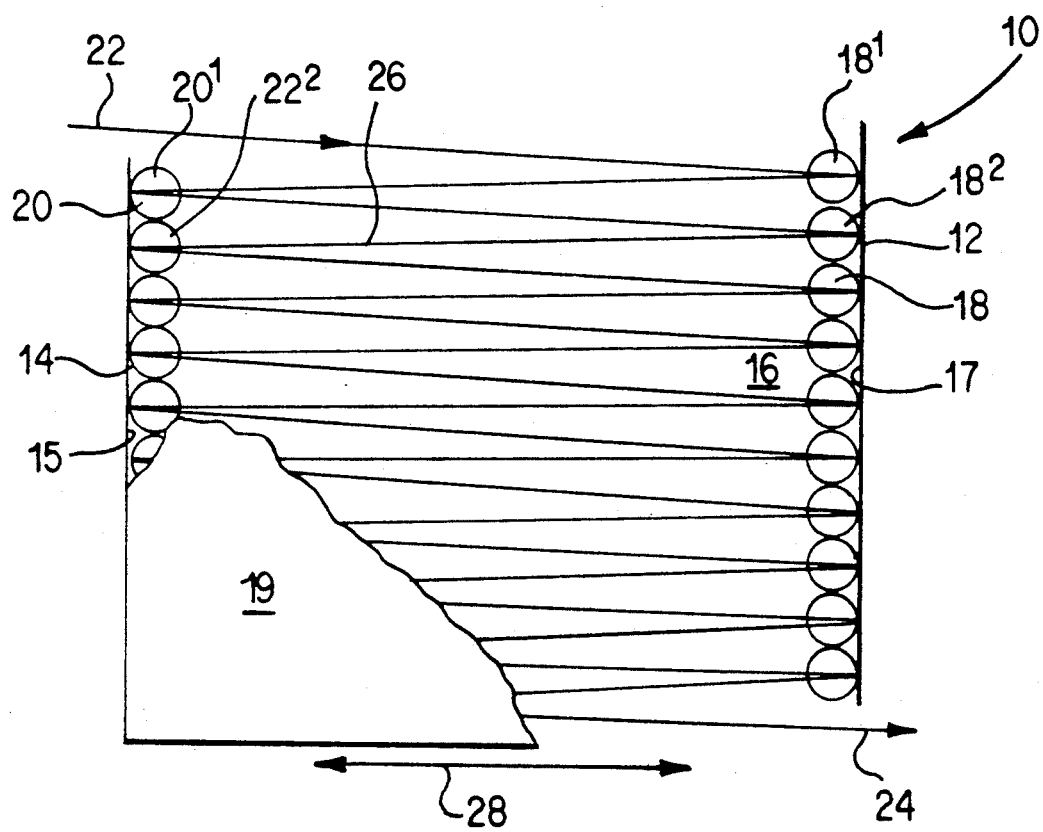
FIG. 1A is a top view block diagram of a first embodiment of the present invention.

Referring to the Figures, wherein like reference numerals refer to like elements, the present invention provides for optical based sensors and methods for measuring physical quantities heretofore not readily measurable based upon multiple reflectivity between two reflective surfaces. The structural relationship between the elements involves placing a separation slab or a thin film containing a material that is modulated by the physical quantity being measured. When the sensitive material is exposed to the measured field, its dimensions typically change in the direction of the field and/or in proportion to the magnitude of the applied field.

The change in distance between the two arrays of reflective surfaces, spheres or diffraction gratings causes the optical path of the sensing beam traversing the apparatus to be phase-shifted. This altered path is sensed using an optical fiber interferometer (FIG. 10) where the light traversing out of the optical path provided by the multiple-pass apparatus is mixed at a fiber coupler to produce an interference flux.

The change in the path length measured by the sensor is proportional to variations in the field intensity measured by the optical detector. The sensor will also multiply the change in optical path length as a result of the change in the separating material based upon the number of passes available in the apparatus. Such an arrangement will enhance the sensitivity of the device.

In the various embodiments described herein, the space between the reflecting surfaces is formed using a piezoelectric, magnetostrictive or a material having a high thermal sensitivity. As a result, the physical quantities measured include magnetic, electrical and thermal properties. However, other arrangements, such as for measuring pressure or velocity, can be used.

The overall arrangement for a sensor using free optical paths is illustrated in FIG. 1A. The embodiment of FIG. 1A provides an apparatus for improving the sensitivity of optical phase sensors within a specific finite volume to provide multiple optical paths to multiple reflectors located on oppositely facing surfaces in the volume.

Specifically, the sensor 10 is composed of side walls 12,14 spaced apart by means of the spacer surface 16, thus forming a rectangular volume between the walls 12 and 14. Located on either side of the cubicle are planar arrays 18, 20 consisting of densely packed spheres. The spheres 18, 20 may be polymer, glass or ceramic. Ceramic materials used in the spheres include polystyrene, silica or titanium dioxide.

The spheres range in size from 30-800 microns in diameter, although in the preferred embodiment, the diameter size ranges between 300-800 microns. The spheres are backed by highly reflective sheatings 15,17. Spacing among the spheres is adjusted so that the maximum amount of light is reflected from each sphere. Adjustment is performed through evaluation of the far-field diffraction resulting from the passage of incident light through the respective spheres 18,20 through the back reflectors 15,17 and out of each sphere 18, 20.

In one arrangement, the spheres are optically clear and are either embedded into the reflection surfaces 15, 17 or adhered against entirely flat surfaces 15, 17 as half-spheres having a flat inner face. The reflective materials of surfaces 15,17 can be polished metals, coated metals, reflective ceramics or an optical fiber bundle. Alternatively, the reflective materials can be coated onto the backs of the spheres 18,20 (not shown) so that a portion of each sphere retro-reflects the optical path out of the optically clear frontal area of the sphere. Microspheres are either attached to the reflective sheatings 15-17 by means of an index matching gel or with other suitable adhesives.

The planes of the spheres 18,20 are separated by a set volume by means of a physically sensitive material such as a magnetostrictive, a piezoelectric, or a thermally sensitive material. In this embodiment, a magnetostrictive metal glass plate is used, although Terfenol D, nickel thin film, iron alloys, ferrites or a nickel zinc ferrite ($NiZnFe_2O_3$) can be used.

The magnetostrictive glass is attached to the spheres 18,20 and walls 11,14 by means of an index matching gel. Side walls (not shown), that are perpendicular to the reflecting walls 12,14, are provided in order to completely enclose the volume in a cube. These walls are constructed using conventionally known materials such as metal, ceramic, glass or plastic. A second magnetostrictive glass layer 19 is then bonded to walls 12,14 and the side walls creating a sandwiched structure having two magnetostrictive layers.

An optical fiber or appropriate light source 22 is connected to one end of the sensor 10 to provide a collimated beam 22 for the sensor 10. A collimated light is therefore provided along the path 26. The optical path exits the sensor at 24 where it is then applied to a fused coupler in an interferometer (FIG. 10) so that the interference pattern can be compared to a reference.

In operation, the optical path 26 enters the first micro-sphere $18^1$ on surface 12. The light is then retroreflected back in the direction of the plane 14 and is incident upon the first sphere $20^1$ on that surface. The light is then reflected from sphere $20^1$ back toward the second sphere $18^2$ on surface 12. Again, the light is retroreflected back from sphere $18^2$ towards the second sphere $20^2$ on surface 14. The optical path is multiply reflected back and forth across the magnetically sensitive cavity spacer until the optically collimated beam exits the sensor at 24.

The multiply reflective property of the sensor is based on the arrays of spheres 18 and 20 arranged so that the spheres are offset by one-half sphere diameter from mutually corresponding spheres on an opposite surface. As previously described, the spacing among the spheres 18,20 is adjusted so that the maximum amount of light 26 is reflected from each sphere.

When the magnetostrictive glass layers 16 and 19 are subject to a magnetic field, the dimensions of the magnetostrictive glass layers change in the direction of the field 28 in proportion to the applied field. As a result, the distance between spherical arrays 18 and 20 modulates the optical path 26. The apparatus will multiply the change in the optical path length observed as a result of the number of reflective passes available to it, creating an enhanced sensitivity for the measured quantity.

Figure 10:
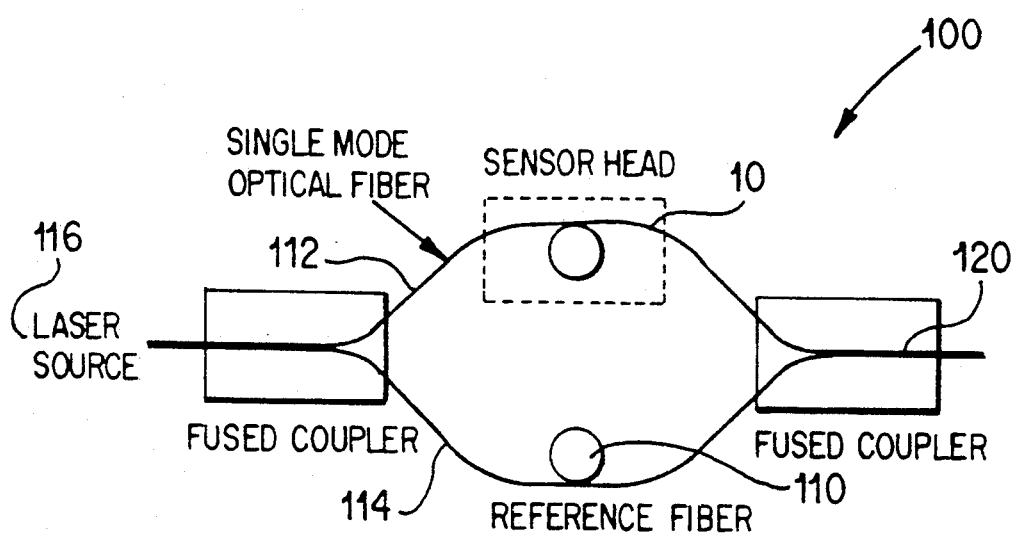
FIG. 10 illustrates an interferometer arrangement employing the sensor of the present invention.

As shown in FIG. 10, an interferometer 100 is used for measuring the detected physical quantity. The interferometer, which is connected to laser source 116 through a fused coupler 112,118, consists of two arms: a sensor arm containing the sensor of the instant invention and a reference arm 114 having a reference fiber 110. Optical outputs from the sensor and reference arms 112, 114 are mixed at a fused fiber coupler 120 thus producing interference effects so that the change in path length in the fibers 112, 114 is proportional to variations in the field intensity of the optical detector.

Figure 1B:
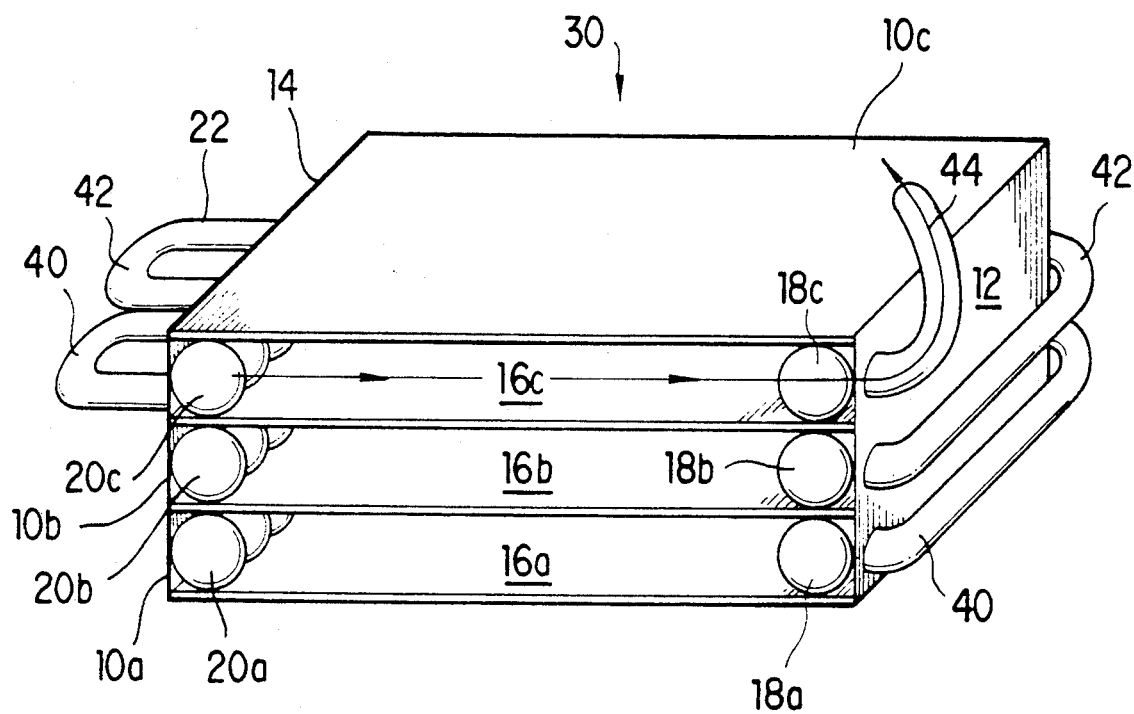
FIG. 1B is a cross-sectional side view of a sandwich version of the first embodiment illustrated in FIG. 1A.

Referring now to FIG. 1B, a sandwich structure, employing multiple coupled sensors of the type shown in FIG. 1A, is illustrated. As shown, each of the sensors 10 are sandwiched one on top of the other creating a plurality of magnetostrictive layers 16a, 16b and 16c. The layers are capped by a top magnetostrictive layer 19. The output from each of the fiber sensor layers 10 is channeled through optical carrying fibers 40 and 42 which guide the optical beams to the input of an adjacent sensor 10b or 10c or to the analysis circuitry of the interferometer 110. Thus, the optical fiber 40 guides the output collimated light beam 24 from the sensor layer 10a to the input 22 of the sensor layer 10b. Similarly, optical fiber 42 redirects the output optical beam 24 to the input 22 of the sensor layer 10c. The output of sensor layer 10c, in turn, is conducted, via optical fiber 44, to the measuring interferometer shown in FIG. 10.

Figure 2:
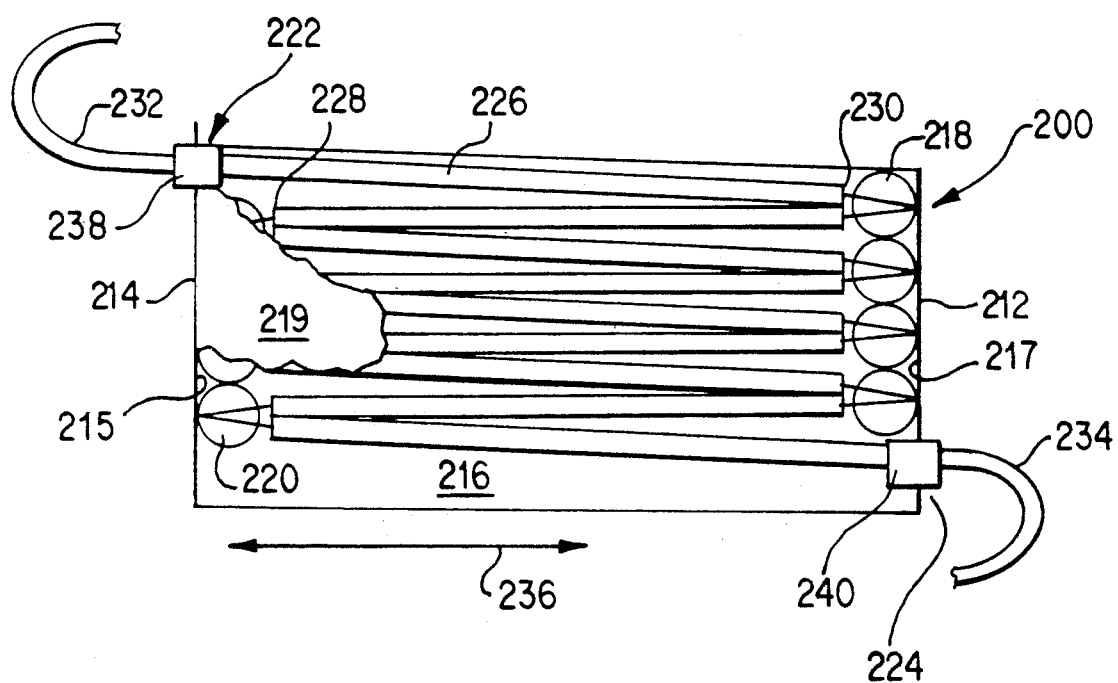
FIG. 2 is a top view block diagram of a second embodiment of the present invention.

FIG. 2 illustrates a top view of a second embodiment of the invention 200 based on employing short optical fibers 226 as guidepaths for directing passes of the optical beam. The structural features of the fiber based embodiment resemble those shown in FIG. 1A.

The device consists of walls 212, 214 having reflective inner surfaces 215, 217 and a plurality of microsphere 218, 220 which are offset from one another on opposite walls of the sensors. The optical fibers are connected at an input end 222 to a graded index (GRIN) lens connected to a respective pigtail optical fiber input 232. The optical fiber 232, which is preferably a single mode fiber, is in turn aligned with a laser or other appropriate optical source. A plurality of angled optical fibers are formed inside the sensor cavity and are suspended above the magnetostrictive spacer 216. In other words, the optical fiber array 226 have their respective ends 228 and 230 spaced at a short distance from a mutually realigned microsphere 218 or 220. The fibers are thus capable of free floating within the sensor without physically touching the expanding/contracting surfaces 212, 213 or 216.

The fibers are mounted in the sensor 200 in several different ways.

First, the fibers can be arranged to float within the sensor 200 where the fibers are neither attached to the micro-spheres 218, 220 nor to the magnetostrictive slab 216. In this arrangement, the fibers are maintained in place by means of an index matching fluid gel, an epoxy, or held in suspension in a housing. The optical fibers float or are suspended above the magnetostrictive 216 such that when mechanical strains cause the magnetostrictive to bend or stretch in the direction of arrow 236, the optical fibers do not change their shapes. The optical path, however, is still modulated based upon the change in parallelism between walls 212 and 214 or in the angle in which the collimated light reflects off of the microspheres 218, 220. As a result, a phase shift in the optical beam results due to the change in the location of the retroflective surfaces.

In a second arrangement, the optical fibers are suspended from a top shelf (not shown). In this arrangement, the fibers are either glued or attached to the top shelf by means of a polymeric material which extends down from the top shelf to suspend the fiber array above the magnetostrictive layer 216. The top shelf, in turn, is mounted on a housing that remains unattached with respect to the spacer 216 or side walls 212, 214, thus allowing their free movement. Further descriptions relating to one construction of the shelf housing are provided below in FIG. 3B.

Figure 3A:
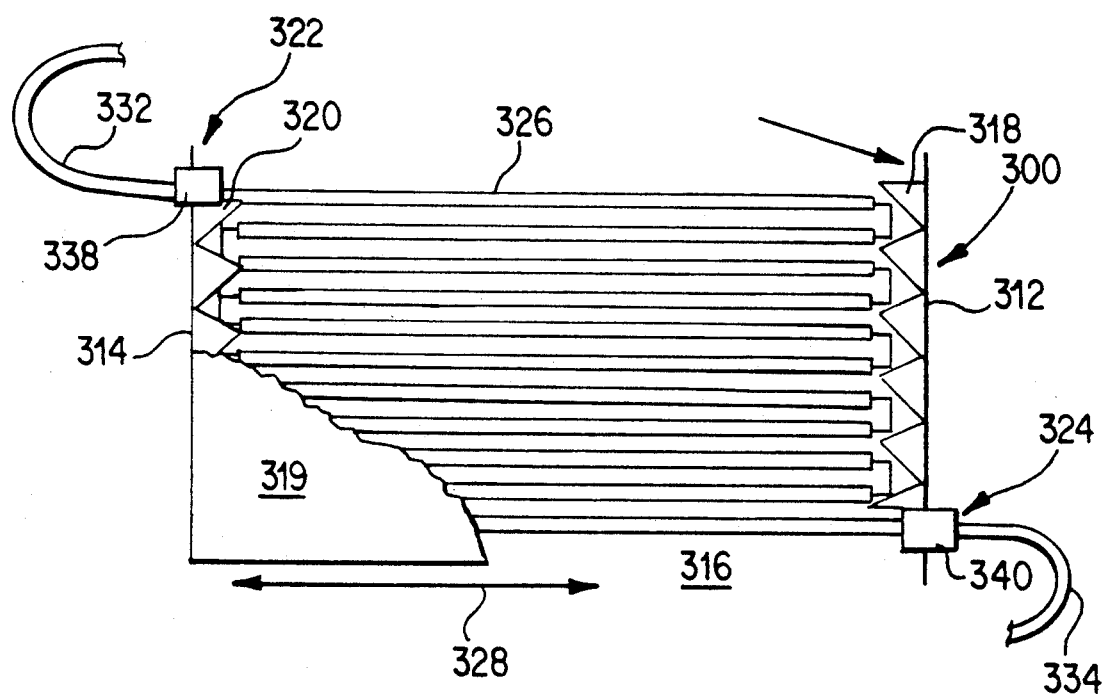
FIG. 3A is a top view diagram representing a third embodiment of the present invention.
Figure 3B:
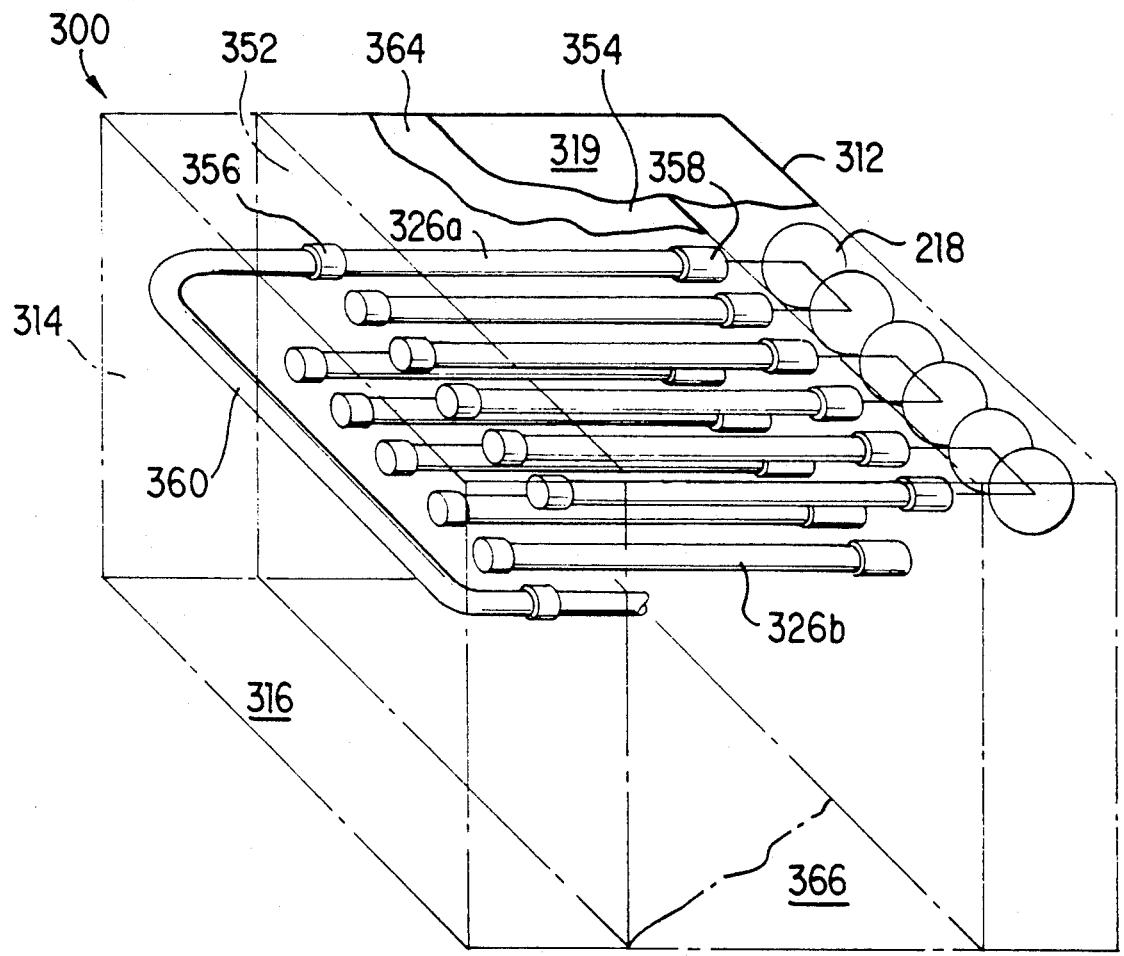
FIG. 3B is a cross-sectional side view of a fourth embodiment of the present invention.

The arrangement of FIG. 3B is suited for a sandwich-type sensor where each pass in the sensor receives an output from an adjacent pass though connecting optical fiber/bundle 360. The reflective walls also can employ micro-spheres 218.

In a third arrangement (not shown), the fibers are directly adhered to the magnetostrictive glass layer 216 as provided in FIG. 2. As a result of attaching the fibers to the layer 216, the fibers expand or contract along with the magnetostrictive material. A shelf structure is provided, in turn, which constrains the bending of the magnetostrictive such that changes in the material are forced to the ends 228, 230 of the optical fibers adjacent to the micro-spheres 218, 220. The strains due to changes in the magnetostrictive material are constrained to the sensor walls causing modulation of the optical beam rather than to the fiber's length. In the event that the configuration shown in FIG. 2 is made into a sandwich structure, as shown in FIG. 1B, then the pigtail output optical fiber 234 is wrapped around to the next adjacent layer to serve as an input to the adjacent sensor. The main advantage of the arrangement shown in FIG. 2 is that the silica-based or polymeric optical fibers remain insensitive to electromagnetic interference.

FIG. 3A shows a fourth alternative embodiment of the invention. The main difference between FIG. 3 and FIG. 2 is that the spheres are replaced with an optical grating. As shown, a sawtooth reflective optical grating, which provides a retro-reflective surface, is used. Moreover, linear arrays of fibers 326 are provided for directing the optical paths between the parallel gratings. The grating has a dimension of approximately one thousand lines per meter and the fibers are approximately 250 microns in diameter. However, any suitably sized grating or fiber can be used. For example, a sinusoidal grating or curved grating would be suitable.

The linear array of fibers 326 are employed as an alternative to the angled array shown in FIG. 2 since a linear array is more easily manufactured.

Referring to FIG. 3B, a fifth embodiment based on a sandwich arrangement employing the linear optical layer 326 of the third embodiment and the microspheres 218 of the second embodiment is shown in perspective view. The optical fiber array 326 is suspended above magnetostrictive layer 316 and spaced from walls 312, 314 by means of metal or polymer sheets 352 and 354 connected together by upper and lower walls 364, 366 respectively. The fibers extend through each sheet clad in a ceramic or polymer ferrule 356, 358. The ferrule is sized to fit closely around the fiber and again tightly fit into apertures in the sheets 352, 354. As in FIG. 1B, each linear optical layer 326 is connected to an adjacent layer by means of a channeling fiber 360 to provide the output of a lower sensor arrangement 326a to an upper arrangement 326b. This arrangement thereby enables the fibers to remain unaffected by the relative movement of the magnetostrictive layers 316, 319.

Figure 3C:
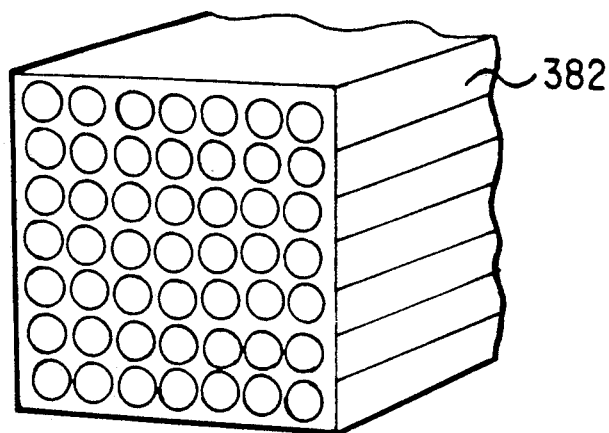
FIG. 3C is a perspective cross-sectional view of a fiber bundle block array.

The fibers of FIG. 3B can be formed into solid blocks of fiber arrays. For example, as shown in FIG. 3C, the fibers can be linearly arranged in a plurality of separate polymer blocks stacked together into an array 380. Alternatively, the fibers can be packed into a volume with polymer formed around the fiber bundles (not shown).

Figure 3D:
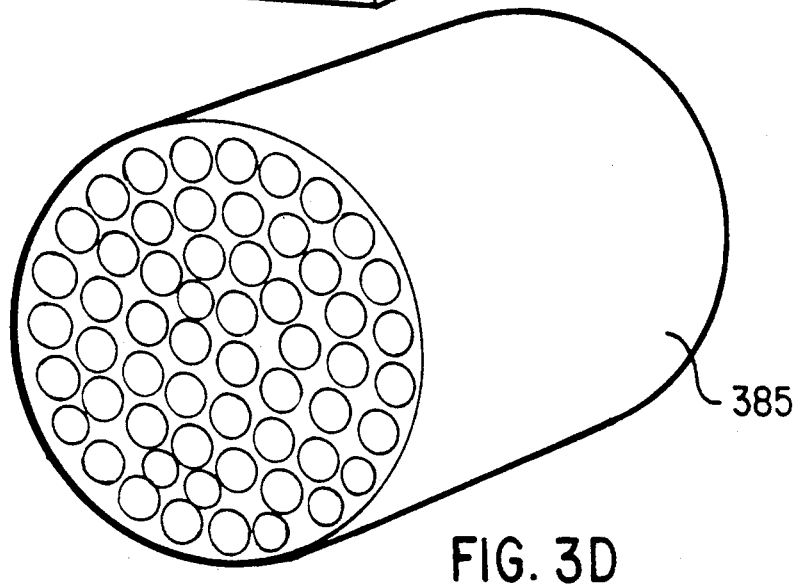
FIG. 3D is a cross-sectional perspective view of a fiber bundle tube array.

In another arrangement, as shown in FIG. 3D, the fibers are stacked together and a tube sheating comprising, for example, a sensitive material such as a magnetostrictive is heat-shrunk to hold the fibers together in a bundle 385.

Figure 3E:
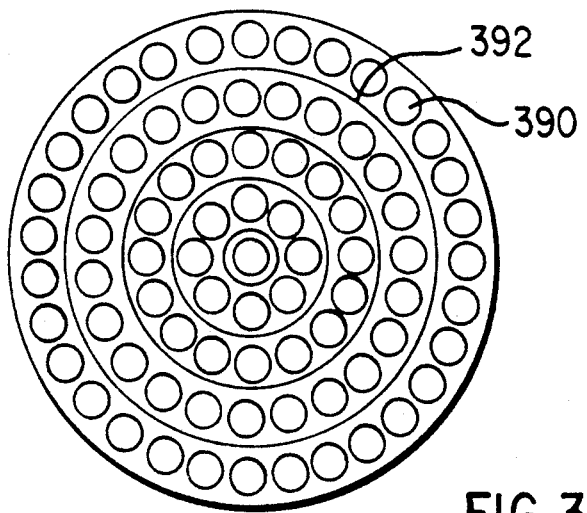
FIG. 3F is a cross-sectional view of a fiber bundle ringed array.

The tubular arrangement 390 of FIG. 3E consists of circular arrays of fibers formed about the circumference of the tube in contiguous layers, each layer being separated by a magnetostrictive sheath 392. As a result, a multiringed, multi-layered sensor structure 395 is formed where each ring is separated by a magnetostrictive and is connected at its end by appropriate channeling fibers (not shown).

Figure 3F:
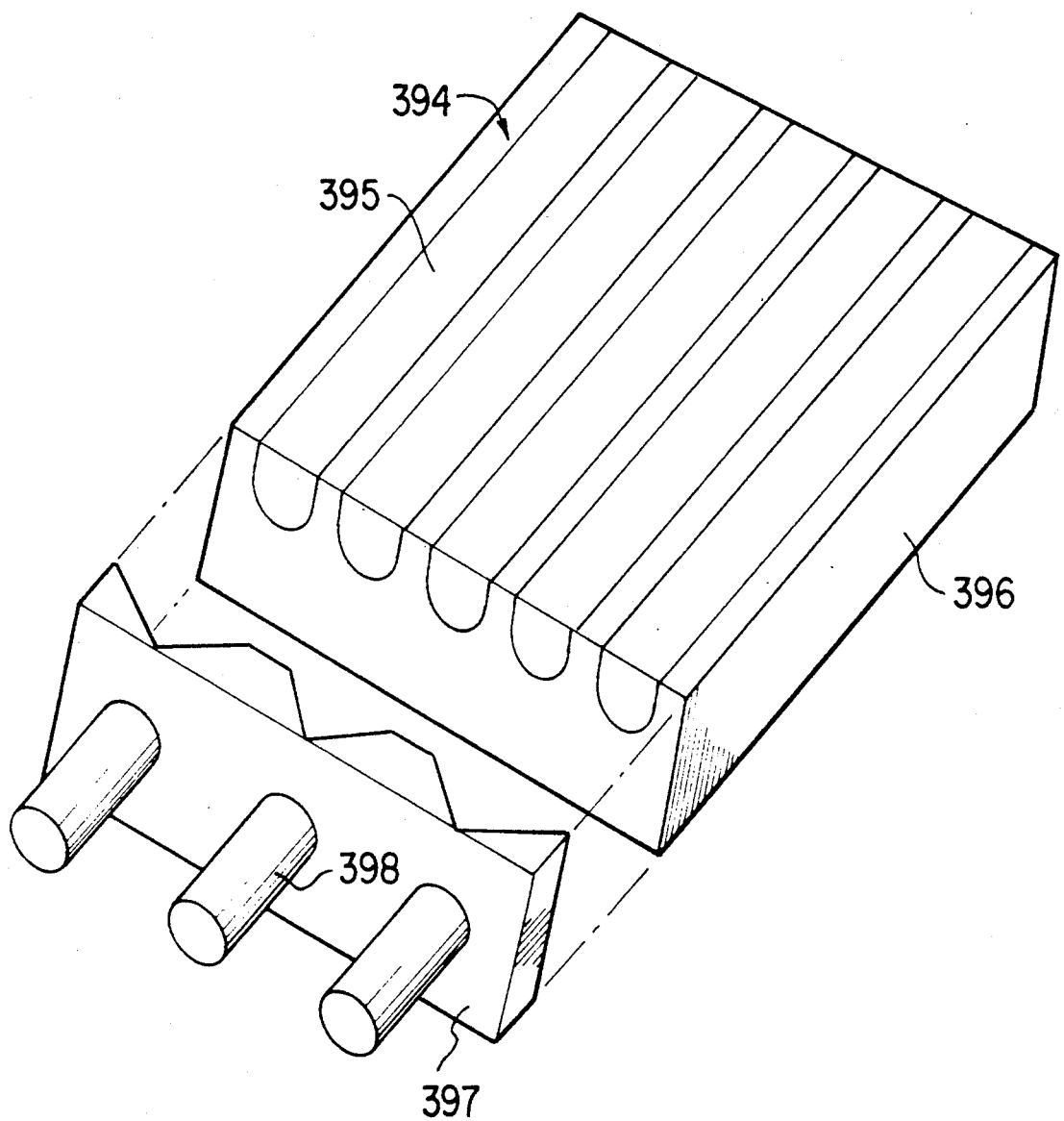

A further embodiment, as shown in FIG. 3F, is an integrated optical sensor 394 where optical channels are formed on a ferroelectric material 396 comprising, PZT, PLZT, LiNbO₃, polydiacetylene, polystyrene, silicon, GaAs or CdTe. End plate retroreflectors 397 having optical fiber inputs/outputs 398 can then be bonded to the optical channel structure. The device can be formed by sputtering magnetic film or depositing it by CVD or electrolysis onto the ferroelectric material. Multiple fiber outlets can then be used to provide a delay line. One wall of the sensor can be replaced with a surface acoustic wave device (not shown) in order to form a light modulator.

Figure 4:
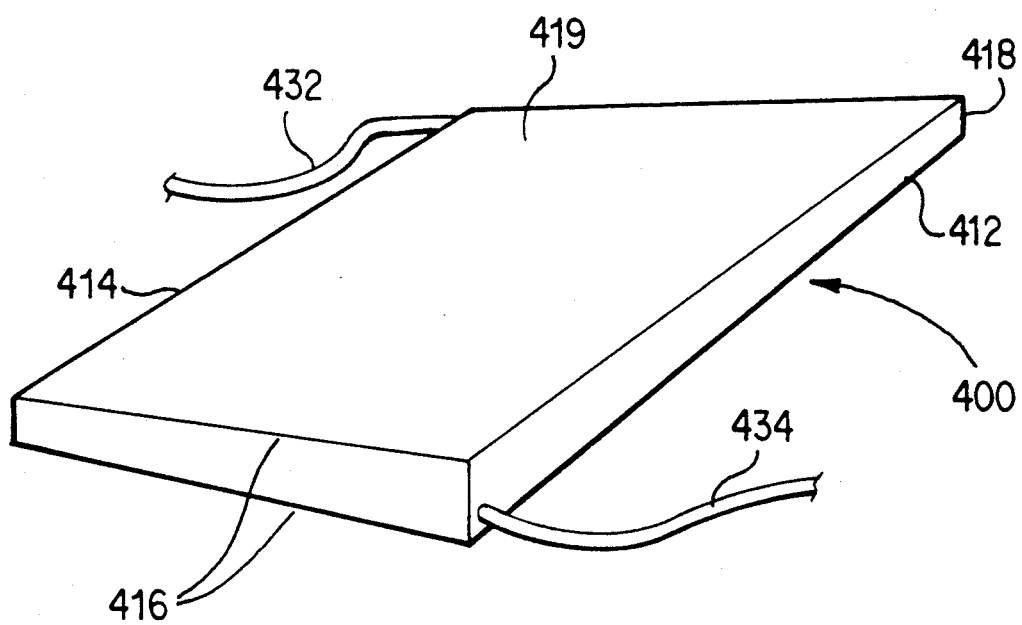
FIG. 4 is a perspective view of a sandwich multiple sensor structure of the sensors illustrated in FIG. 3.

FIG. 4 is a perspective view of a volumetric multiple path fiber-optic sensor. In this design, amorphous magnetostrictive ribbons are used to form spacer surfaces 416. Parallel walls 412 and 414, each consisting of grooved diffraction gratings, are disposed along the interior walls 412, 414. As previously discussed, the optical fiber 434 connects the output of the sensors to the inputs 432 of adjacent sensors. The sensor thus can be built into a small volume and yet provide increased sensitivity.

The optical output of adjacent layers also can be provided to one another through orienting the retroreflective spheres in such a manner that the optical path is directed vertically from one layer to the next through a clear glass separator 416. Alternative arrangements would be to either connect the output of one layer to the input of an adjacent layer through a porthole formed in the magnetostrictive surface 416 and the top magnetostrictive layer 419, or to form multiple layers in an open space so that vertical paths can be as easily arranged as horizontal optical paths.

Figure 5:
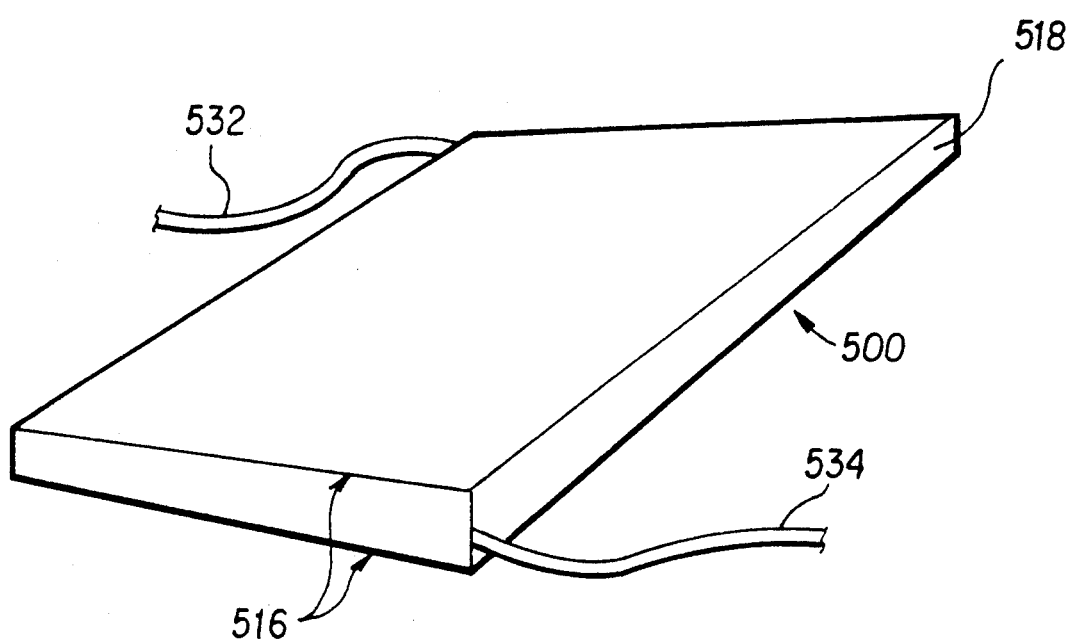
FIG 5 is a perspective view of a sandwich multiple sensor arrangement of the sensors shown in FIG. 2.

Referring now to FIG. 5, a perspective view of a volumetric multiple path fiber-optic sensor is shown. The arrangement of FIG. 5 differs from FIG. 4 because microspheres are placed along the side walls 512, 514 rather than the gratings. In this arrangement the surfaces 516 are comprised mainly of magnetostrictive ribbons, as previously discussed.

Figure 6:
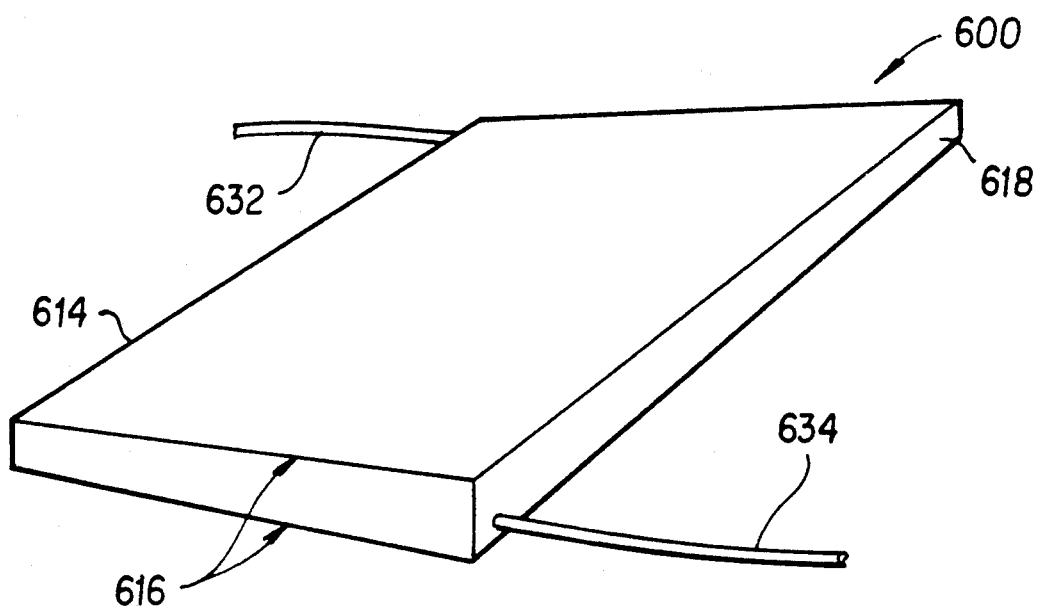
FIG. 6 is a perspective view of a sixth embodiment of the invention consisting of a sandwich structure composed of multiple sensors using polymer piezoelectric film.

With regard to FIG. 6, a perspective view of a sandwich arrangement using a polymer piezoelectric film 616 is shown. Any conventionally known piezoelectric material can be used although the preferred materials contemplated in the present arrangement include quartz, lead zirconate titanate (PZT), polyvinylylidene difluoride (PVDF), barium titanate or barium magnesium fluoride. The advantage of the piezoelectric material 616 is that it is adapted to sense electrical fields. Optical beams provided across the sensor 618 through an input 632 are then provided to an interferometer comparator (see FIG. 10) or another appropriate analyzer through optical guide 634. The optical fibers or free-form light paths are used with the piezoelectric material 616 in the same manner described above with regard to the magnetostrictive embodiments of FIGS. 1-5. The piezoelectric arrangement shown in FIG. 6 also can be used either in a hydrophone or to detect any other sound waves, such as ultrasound. Alternatively, the piezoelectric design can be used to detect mechanical strain, pressure or temperature.

Figure 7:
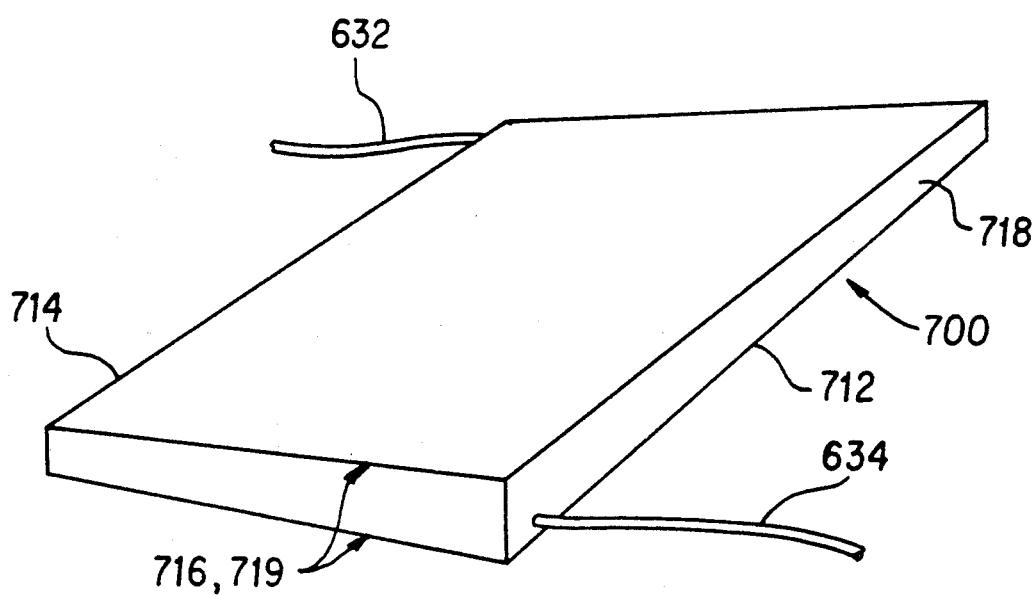
FIG. 7 is a perspective view of a seventh embodiment of the invention consisting of a sandwich multiple sensor structure utilizing high thermal expansion metallic non-metallic material.

FIG. 7 is a perspective view of an arrangement of the sandwich structure. As shown, micro-spheres 718 are embedded along walls 712 and 714. A thermally sensitive material, such as a metallic or a non-metallic layer, is provided in sheets 716, 719 in order that the temperature can be readily measured by the multiple sandwiched layer. As a result of the construction shown in FIGS. 4-7, the multiple layers are able to sense the physical quantity with varying degrees of sensitivity. For example, the first layer may have a 100% sensitivity to the phenomena being measured. The second layer may be 95% effective and the third layer less sensitive. The resulting structure thus provides a way of multiplying the actual sensitivities such that a more accurate measurement is achieved across a larger area. Each respective layer has a lower degree of sensitivity that can be correspondingly corrected by means of a coefficient.

Each of the layers of the sandwich structure are connected in such a manner that coupling between layers is increased. Thus, in terms of the piezoelectric or thermally sensitive designs, coupling materials are arranged layer-to-layer causing the vibration or the expansion of the material to be as uniform as possible between layers. To increase coupling quality it is desirable to use materials that are optically clear. For example, piezoelectric or thermoelectric materials may be made of clear polymers such as low density polyethylene or high expansion clear polymerics. Shielding between the surfaces can be provided by metallizing each of the layers. Instead of providing multiple layers, a single bottom layer and a single top layer can be employed.

Figure 8:
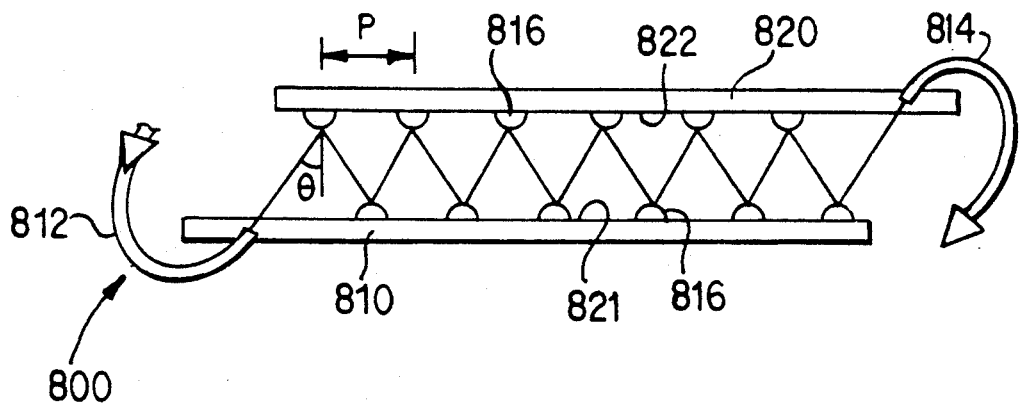
FIG. 8 is a top view diagram of an eighth embodiment of the invention for an optical waveguide channel sensor with linearly arranged micro-spherical lenses.

FIG. 8 is a top block diagram view of an optical waveguide channel sensor 800 that uses linearly arranged micro-spherical lenses 816 that are located on mutually parallel surfaces 810, 820. Each of the surfaces 810 and 820 include a mirrored inner surface 821, 822. The surface 820 consists of an inert material while the lower wall or mirror 810 is sensitive to the physical quantity being measured. As a result, as it expands or contracts, the distance between the reflective spheres 816 changes. The change in parallelism modulates the optical path length and the intensity of the light that exits through optical fiber 814.

The arrangement of FIG. 8 is particularly suited as a sensing head for the interferometer shown in FIG. 10. The material comprising layer 810 can be a magnetostrictive or a piezoelectric substrate having embedded small spherical mirrors. The input and output fibers 812, 814 are single mode optical fibers and the spheres are silvered so that the location in which the light hits the silvered mirror alters the angle in which the light retroreflects off of the mirror. As an alternative, a curved mirror can be used.

A unit of expansion P is shown such that the rate of travel increases $2 \times 2^2$ the unit of expansion such that P represents multiplying the unit of expansion based upon the number of spheres. The spherical mirrors 816 can be replaced by a sawtooth, sinusoidal or curved grating.

Figure 9:
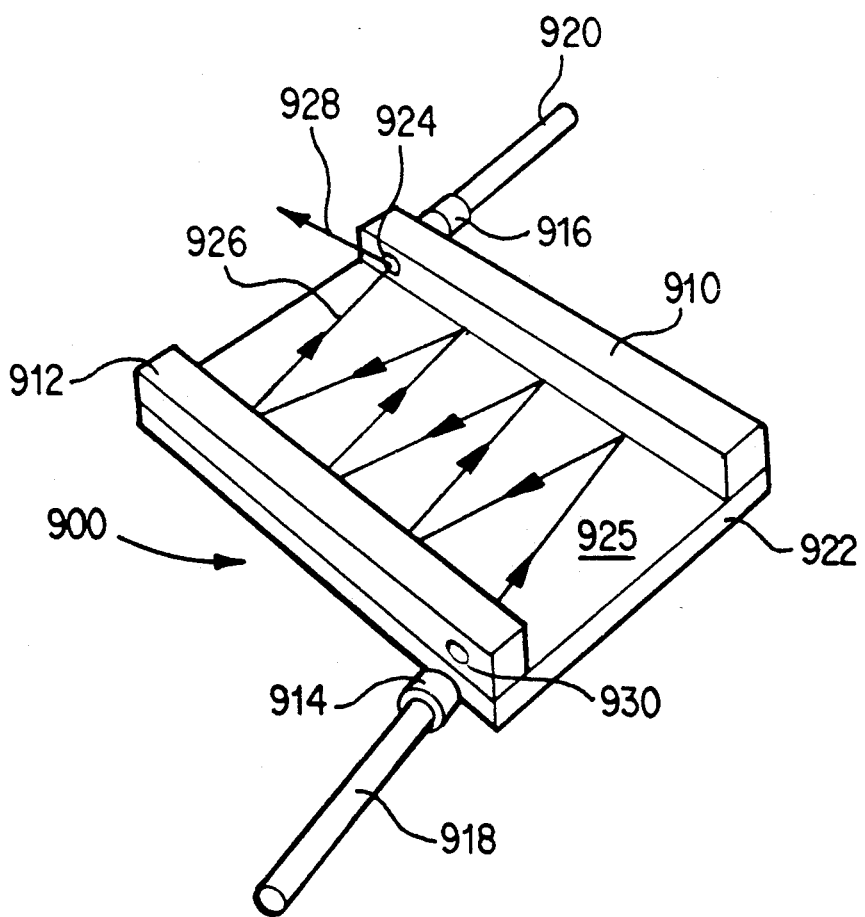
FIG. 9 is a perspective view of a ninth embodiment of the invention for an optical delay line sensor for optical fiber magnetometry.

FIG. 9 is a perspective illustration of an optical delay line sensor for an optical magnetometer. The delay line can be provided with multiple pick-off points enabling changes in the field to be measured at specific points across a given volume. The delay line also can provide a correlation function as a signal processing element.

As shown, the magnetometer 900 has two strip rectangular front surface mirrors 910, 912 facing one another. An optical fiber 918 having suitable optical properties is used to direct a laser beam input through an aperture in the surface mirror 912. A second aperture 924 is used to collect the beam for transmission by output fiber 920. The mirror set 910, 912 is positioned so as to produce an optical delay by adjusting the angle between the two mirrors based upon the effect of a sensed field on the spacer layer 925. The angle between the mirrors is optimized by measuring an optical delay (path length) and then adjusting the mirrors to achieve maximum delay. The magnetostrictive or piezoelectric material 925 is adhered to the mirror set 910 and 912 such that a large change in the length of the magnetostrictive material results in a change in the optical path length through the delay line set 900. As an alternative embodiment, either concave, convex or spherical mirrors can be linearly arranged to provide a suitable object for optical beam collimation, beam reflection and ray guiding efficiencies. Further, the delay line can be formed into a sandwich structure, where an array of planar mirrors 910.912 are provided to direct the optical path and redirect the substantially planar optical path from one row of mirrors, or one row of flat reflective surface to an adjacent row. The optical path 926 is directed by angling mirror 924 to direct the optical path upward, as shown at 928 in FIG. 9.

In addition to the applications described above, the present invention also provides for a method and apparatus for measuring the presence of chemical entities within a fluid confined between multiple reflecting sensor surfaces. For example, the present invention can be employed to sense the presence of an organic material which floresces upon excitation by an argon-ion laser with a wavelength of 0.488 to 0.514 microns. As another example, a membrane-specific dye, such as indocarbon cyanine can be added to a clear fluid, such as water or ethyl alcohol. e.t.c. Between the two reflective surfaces, the output signal in both examples, would be proportional to the amount of living organisms present. Similarly, the input signal to the sensor may be linearly polarized, and the relative polarization of the output signal may be used to measure the properties of the fluid such as the presence of micro particles, bacteria or the flow characteristics of the fluid moving through the sensor.

A specific embodiment of the above can be found in the structure of FIG. 9. In this embodiment, a fluid having weak florescent properties fills the cavity between reflective surfaces 910, 912. An example of such fluid is fluorisceiniso thiocyanate. However, if water is used, the sensor can be operated in the UV range (approximately 260 nm), while the fluorescing fluid receives inputs between 513 nm to 580 nm. The invention can then be used to measure bacteria in said fluid since the output of fiber 920 is proportional to the amount of bacteria in the fluid. Such sensors can also be used to measure gases, such as the quantity of pollutants contained in a gas.

The present invention also can be combined with, for example, a controllable source of the measured quantity, such as an electromagnet in order to create an optical processing device or switch.

Although only the preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A sensor for a physical property, comprising:
a light source;
light transmitting means for communicating with said light source, said light transmitting means comprising a row of optical fibers disposed between a reflecting means for multiply reflecting light provided from said light transmitting means; and across a sensitive material means connected to said reflecting means whereby said reflecting means and said sensitive material means are affected by a physical quantity or property causing modulation of said multiply reflecting light wherein said optical fibers are arranged in a polymer block such that the optical fibers are suspended in said block above said sensitive material means and in isolation from said reflecting means and sensitive material means so that said optical fibers remain stationary when said sensitive material means are subjected to said physical quantity or property.

2. The apparatus according to claim 1, wherein said polymer block of optical fibers is arranged in a cube comprising an array of linearly disposed fibers.

3. The apparatus according to claim 1, wherein said optical fibers are arranged in mutually concentric circles which are formed into said polymer block such that optical fibers are formed into a tubular shaped bundle comprising linearly arranged rings of fibers.

4. The apparatus according to claim 1, further comprising a frame means for hanging said polymer block containing said linearly arranged optical fibers whereby said frame means is not connected to said reflecting means or said sensitive material means such that movements in said sensitive material means and reflecting means are not imparted to said polymer block of fibers.

5. The apparatus according to claim 1, wherein said optical fibers are provided in a linear array of fibers wherein each fiber hangs from a pair of walls comprising a plurality of apertures wherein each aperture is fitted with a ferrule which is respectively clamped to a respective optical fiber and whereby said walls having apertures are adapted to remain inert despite movement of said sensitive material means and reflecting means.

6. The apparatus of claim 1, wherein said optical fibers are arranged to extend a short distance away from said reflecting means so as not to be connected to said reflecting means.

7. The apparatus of claim 1, wherein said reflecting means are mutually parallel whereby when said sensitive material means is exposed to said physical quantity or property, mechanical strains imparted to said sensitive material will alter the distance, the parallelism or the relative position between said reflecting means causing phase shifting in an optical path of said light transmitting means whereby a resulting interference pattern produced by said light transmitting means is changed.

8. The apparatus according to claim 7, wherein said reflecting means further comprising a pair of plane mirror means disposed at opposing ends of said sensitive material means in order to orient input/output beams from said light source into an evaluation device.

9. The apparatus according to claim 1, wherein said reflecting means comprises a row of micro-spheres having reflective surfaces.

10. The apparatus according to claim 9, wherein said spheres are clear and are mounted adjacent a plane reflective surface such that said light transmitted to said spheres are reflected back out of said spheres.

11. The apparatus of claim 9, wherein said spheres are made of a polymer glass/ceramic wherein said ceramic materials include polystyrene, silica or titanium dioxide.

12. The apparatus of claim 9, wherein said spheres are arranged so that the spheres are offset by one- C: half sphere diameter from a mutually corresponding sphere on said opposite reflecting means surface and spacing among said spheres is adjusted so that a maximum amount of light from said light transmitting means is reflected back from each sphere.

13. The apparatus according to claim 9, wherein said spheres have a coated reflective surface thereon for retroreflecting said light from said light transmitting means to an opposite array of spheres.

14. The apparatus according to claim 1, wherein said reflecting means comprises linearly arranged microspherical lenses wherein each said lenses are embedded along a mirrored surface or comprise a silvered outer surface.

15. The apparatus according to claim 1, wherein said sensitive material means comprises a magnetostrictive material such that said physical quantity is a magnetic field.

16. The apparatus according to claim 15, wherein said magnetostrictive material comprises magnetostrictive glass.

17. The apparatus according to claim 15, wherein said magnetostrictive material comprises Terfenol D.

18. The apparatus according to claim 16, wherein said magnetostrictive material comprises nickel thin film, iron alloy, or a ferrite.

19. The apparatus according to claim 16, wherein said magnetostrictive material is sensitive to the whole magnetic field being sensed rather than a single point in said magnetic field.

20. The apparatus according to claim 16, wherein said magnetostrictive material is adapted to sense chemical changes in a human body.

21. The apparatus according to claim 16, wherein said magnetostrictive material is wrapped around bundles of optical fibers.

22. The apparatus according to claim 1, wherein said sensitive material means comprises a piezoelectric material.

23. The apparatus according to claim 22, wherein said piezoelectric material comprises either lead zirconate titanate (PZT) polyvinyldene diflouride (PVDF), barium titanate, or barium magnesium fluoride.

24. The apparatus according to claim 22, wherein said piezoelectric material is adapted to sense sound, vibration, mechanical strain or temperature.

25. The apparatus according to claim 1, wherein said sensitive material means comprises fluorescent dyes on optical fiber surfaces.

26. The sensor according to claim 1, wherein said sensor exhibits increased sensitivity since each pass in said sensor of said multiply reflective light represents a separate sensor reading.

27. The apparatus according to claim 1, wherein said sensor comprises an arm of an interferometer whereby the output of said sensor produces a reflective fringe pattern that is compared to a reference fringe pattern from another arm of said interferometer.

28. A multiple sensor responsive to a physical quantity or property to be evaluated, comprising:
light transmitting means for receiving light from said light source and for transmitting light from one sensor to an adjacent sensor;
reflecting means for multiply reflecting said transmitted light in each of multiple sensor layers; and
sensitive material connected to said reflecting means and for spacing said reflective means apart whereby said sensors are formed into a multi-layered sandwich where each layer provides a separate multiply reflective row of elements.

29. The apparatus according to claim 1, wherein said sensitive material means comprises pen silica tubes containing fluorescent dyes.

* * * * *